United States Patent [19]

Carlqvist et al.

[11] Patent Number: 4,571,719
[45] Date of Patent: Feb. 18, 1986

[54] FIR-TYPE BALANCE FILTER INCORPORATED IN THE TRANSMITTER-RECEIVER UNIT IN A TELECOMMUNICATION SYSTEM

[75] Inventors: Bengt R. Carlqvist, Bromma; Lars T. E. Svensson, Skärholmen, both of Sweden

[73] Assignee: Telefonaktiebolaget L M Ericsson, Stockholm, Sweden

[21] Appl. No.: 514,824

[22] PCT Filed: Nov. 2, 1982

[86] PCT No.: PCT/SE82/00362
§ 371 Date: Jun. 16, 1983
§ 102(e) Date: Jun. 16, 1983

[87] PCT Pub. No.: WO83/01715
PCT Pub. Date: May 11, 1983

[30] Foreign Application Priority Data
Nov. 2, 1981 [SE] Sweden .................. 8106445

[51] Int. Cl.$^4$ .................. H04J 15/00; H04L 5/14
[52] U.S. Cl. .................. 370/32; 179/170.2; 179/170.6
[58] Field of Search .................. 179/170.2, 170.6; 375/14, 16; 370/32; 333/18; 364/724

[56] References Cited

U.S. PATENT DOCUMENTS

| 4,162,378 | 7/1979 | Baudoux et al. | 179/170.2 |
| 4,261,051 | 4/1981 | Ohnishi et al. | 375/14 |
| 4,425,483 | 1/1984 | Lee et al. | 179/170.2 |

FOREIGN PATENT DOCUMENTS

| 036696 | 9/1981 | European Pat. Off. | 179/170.6 |

OTHER PUBLICATIONS

Mueller—"A New Digital Echo Canceler"—IEEE Trans. on Comm. vol. COM-24, #9, Sep. 1976, pp. 956–962.

Holte et al.—"A New Digital Echo Canceler"—IEEE Trans. on Comm. vol.-COM 29, No. 11, Nov. 1981, pp. 1573–1579.

*Primary Examiner*—Joseph A. Orsino, Jr.
*Attorney, Agent, or Firm*—Roberts, Spiecens & Cohen

[57] ABSTRACT

An FIR-type balance filter for preventing, in adaptive echo cancellation in a telecommunication system in which digital information transferred in duplex over a single conductor pair, that the local data transmitter disturbs the local data reception. The filter is thereby arranged so that the total number of links (N) in the filter is divided into at least a first group (I) and a second group (II). The apparatus contains a memory (MI) addressable from the filter links and said first group, there being written into and read from said memory the correction values from and to a correction unit (KB1), sending signals for correcting the filter parameters. The memory (M1) also sends signals to a summing circuit (A2), to which are also supplied the output signals from said second group of filter links, said output signals possibly being originated by table look-up in a further memory, or by vector multiplication. A second correction unit (KB2) corrects the filter parameters in said second group. The output signal from the summing circuit is digital-analogue converted and with its sign added to the signal coming from the remote end and transmitted to the local transmitter, thus compensating for the nonlinearity in the echo signal.

11 Claims, 4 Drawing Figures

FIR-TYPE BALANCE FILTER INCORPORATED IN THE TRANSMITTER-RECEIVER UNIT IN A TELECOMMUNICATION SYSTEM

TECHNICAL FIELD

The present invention relates to a balance filter included in a telecommunication system for duplex data transmission. More precisely, there is intended a filter which is incorporated in an echo canceller for inhibiting the effect of an echo signal from the transmit side via the hybrid coupler to the receive side.

BACKGROUND ART

A method and apparatus are described in the Swedish Patent Application No. 8106444-6 for achieving adaptive echo cancellation. The principle of the apparatus will be apparent from the appended FIG. 1. The data sequences $b_n$ and $a_n$ are transmitted on the conductor pair to and from the remote end, repectively. The local end receive units not only receive the signal w(t) from the remote end but also a signal h(t) coming from the local transmitter S. In practical cases, the amplitude of the h(t) signal may be very much greater than that of the w(t) signal. To enable correct detection in the detector D a signal y(t) is subtracted from the received signal. The former is the output signal from the balance filter B, the input signal of which comes from the data sequence $b_n$. The balance filter B is adjusted adaptively with the aid of the correlator unit KB so that y(t) and h(t) become equal in the sampling instants kT. After subtraction there only remains the w(t) signal from which data from the remote end can be extracted.

The balance filter should be of the FIR type (Finite Impulse Response). The output signal of such a filter is defined thus:

$$y_k = y_k(c, x_k)$$

where the parameters of the filter are represented by the vector $$c = (c_0, c_1, \ldots, c_{M-1})$$

and the input signal is written in vector form:

$$x_k = (x_k, x_{k-1}, \ldots, x_{k-N+1})$$

By correlating its input signals the correlator unit KB calculates a correction of the filter parameters:

$$c(k+1) = c(k) + \Delta c(k)$$

where c(k) is the filter parameter vector at the time kT and $\Delta c(k)$ is a correction vector.

The conventional implementation of an FIR filter utilizes the vector multiplication:

$$y_k = \underline{c} \cdot \underline{x}_k = \sum_{n=0}^{N-1} c_n x_{k-n} \text{ (when } M = N\text{)}$$

Here the number of parameters is thus N.

Another way in which to realize a filter of the FIR type is to utilize table look-up. All conceivable output signals are stored in a memory. If each input signal sample $x_n$ can assume L discrete levels the number of possible output signals will be:

$$M = L^N$$

For the memory size to be reasonable, L and N must be relatively small. The implementation can be interesting, particularly in binary data transmission (L=2). The filter input signal vector $x_k$ with N components determines an address j which points out a definite filter parameter $c_j$ in the memory.

$$y_k = c_j; \ j = j(x_k)$$

In vector multiplication the correction vector will be:

$$\Delta c(k) = (\Delta c_0, \Delta c_1, \ldots, \Delta c_{N-1})$$

i.e. all the parameters are updated simultaneously.

In the table look-up the correction vector will be:

$$\Delta c(k) = (0, 0, \ldots \Delta c_j, 0 \ldots, 0)$$

i.e. only one of the parameters is updated at each correction occasion.

It will be seen from the above that the table filter results in large memory space if N is large (the memory size increases exponentially with n). Since in many practical cases it may be necessary to have a relatively large value of N, the table filter discussed above may be unsuitable.

The transmitter unit S, coupler G and lowpass filter LP as well as other units not shown in FIG. 1 in the transmitter-receiver unit give rise to nonlinearities. The signal w(t) coming to the hybrid coupler G from the remote end is comparatively weak. The signal h(t) from the transmitter unit S through the coupler G (the leal signal) is, on the other hand, at least at the beginning of transmit-receive sequence, relatively strong before echo cancellation has managed to come into action. In practical cases, the signal h(t) may be much greater than w(t), e.g. a hundred times as great. Since the signal h(t) passed a nonlinear signal path, components from a given transmitted data symbol $b_k$ arise in the signal h(t), for which a linear balance filter normally cannot compensate. Since the leak signal h(t) can be very much greater than the signal w(t) from the remote end, a minor nonlinearity in the system may also be devastating for echo cancellation if the nonlinearity cannot be compensated.

DISCLOSURE OF INVENTION

In accordance with the present invention, the total filter length N in the balance filter is divided into two, possibly more, parts where N=N1+N2, the part of the filter which is to compensate the greatest echo signal amplitude values, and thereby the greatest nonlinear components also, has a relatively short filter length and table look-up is utilized for this part of the filter. Remaining parts N2 may utilize table look-up or vector multiplication. Since the value N1 can be comparatively small, the total filter requires considerably less memory space, simultaneously as convergence will be quicker than if a conventional table look-up technique were utilized for the whole filter.

An object of the present invention is to provide a balance filter included in a transmitter-receiver unit with adaptive echo cancellation, which has a filter structure such that nonlinearities in the transmitter-receiver path present in practical cases may be compensated. The balance filter is thereby characterized as will be apparent from the characterizing features in claim 1.

The advantage of the filter in accordance with the invention is, apart from compensating nonlinearities in the leak signal, that little memory space is required and a shortened convergence time in the filter is obtained.

BRIEF DESCRIPTION OF DRAWINGS

The invention will now be described in detail with reference to the appended drawings where.

BEST MODES FOR CARRYING OUT THE INVENTION

Figure 1:
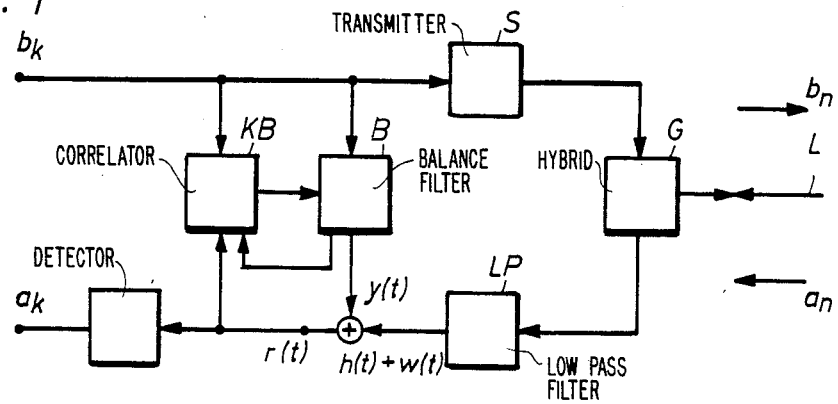
FIG. 1 is a block diagram of a transmitter-receiver unit for duplex data transmission.

The block diagram of FIG. 1 has been previously described under the title "Background art". The new implementation of the balance filter B in FIG. 1 will be seen from the block diagram of FIG. 2. The input to the transmitter unit S on which the data symbols $b_k$ occur is connected to a first delay circuit T1 included in the balance filter B. In the embodiment illustrated in FIG. 2, the balance filter contains two groups I and II of delay circuits. The first group I includes the two delay circuits T1 and T2 and the other group II the circuits T3, T4 and T5. It is naturally possible to extend the number of delay circuits as well as the number of groups. Each circuit T1-T5 delays the incoming value $b_k, b_{k-1}, \ldots$ a time T corresponding to the transmitted data speed.

In group I there is also included an addressing unit AE1, the inputs (in this case 3) being connected to the inputs of the delay circuits T1-T3. The unit AE1 is connected by its output to the input of a memory unit M1 storing the coefficients $c_j$ in table form, such coefficients constituting the filter parameters. Group I utilizes table look-up and the number N1 is here =0.3. The values $b_k, b_{k-1}, b_{k-2}$ are applied to the addressing unit AE1, where a given address is formed in response to the value of the symbols $b_k, b_{k-1}, b_{k-2}$. The address thus fetches from the memory unit M1 a given coefficient $c_k$ which occurs on the output of the unit M1.

In the embodiment illustrated here, group II in the balance filter B also utilizes table look-up as does group I. In the same way as for group I a given coefficient $c_j$ is pointed out in the memory unit M2 from the addressing unit AE2 in response to values of the symbols $b_{k-3}, b_{k-4}, b_{k-5}$. Here N is =6; N1=3 and N2=3. The coefficients $c_k$ from group I and $c_j$ from group II are applied to both inputs of a summing circuit A2. The output of this circuit is connected to a digital-to-analogue converter DA for converting the digital sum $c_k + c_j$ to the analogue signal y(t). This signal is the correction signal for the analogue signal h(t)+w(t) coming from the coupler G to the receive side and, as above, h(t) is the leak signal and w(t) the remote signal. The realtionship y(t)=h(t) applies for correct balancing. Since the balance filter has taken consideration only to the six first data symbols, according to the illustrated embodiment, the signal y(t) will only be an approximation of h(t). The effect of subsequent data symbols $b_{k-6}$, $b_{k-7}$ etcetera is negligable in practice however, and y(t) gives a sufficiently good approximation of the leak signal h(t).

The output of the summing circuit A1 is conventionally (according to FIG. 1) connected to a sampling circuit SH, which samples the corrected signal $r(t) = h(t) + w(t) - y(t) \approx w(t)$ at the sampling instants $t_k$, $k=0,1,\ldots$, so that a sampled signal $r_k$ is obtained. The signal $r_k$ is applied to the detector D on the receive side to form an estimation of the transmitted data flow $a_n$ from the remote end. Both flows $r_k$ and $b_k$ must be uncorrelated for correct balancing to be performed by the balance filter. Two correlators KB1 and KB2 operating in prallel are therefore connected between the detector D and sampling unit SH. These are of the same implementation and are described in the Swedish patent application mentioned in the introduction. Both units KB1 and KB2 have an input connected to the input of the transmitter unit S and thus receive the data flow $b_k$. The output of correlator KB1 is connected to the memory unit M1 and the output of correlator KB2 is connected to the unit M2, to send correction signals to these units. Furthermore, an output of each of the memory units M1, M2 is connected to an input on the correlators KB1, KB2 for supplying the coefficient $c_j$, $c_k$ which is to be corrected. In either correlator KB1, KB2 a correlation is made of the values $r_k$ from the sampling unit SH. As long as there is correlation between the values $r_k$ and $b_k$, unambigous correction signals will be added to the coefficients $c_j$, $c_k$ and new values $c_{j+1}$, $c_{k+1}$ will be fed to the memory units M1, M2. When correlation is no longer present, this means that the signals $r_k$ and $b_k$ are independent and correction for the leak signal h(t) is made by the balance filter. The correlation is performed in the units KB1, KB2 by the coefficient $c_j$, $c_k$ (which is to be corrected) being pointed out by the data values $b_k, b_{k-1}, b_{k-2}$ (for KB1) and $b_{k-3}$, $b_{k-4}, b_{k-5}$ (for KB2), correction of the pointed-out coefficient taking place in response to the value of $r_k$, as described in the above-mentioned patent application.

Figure 2:
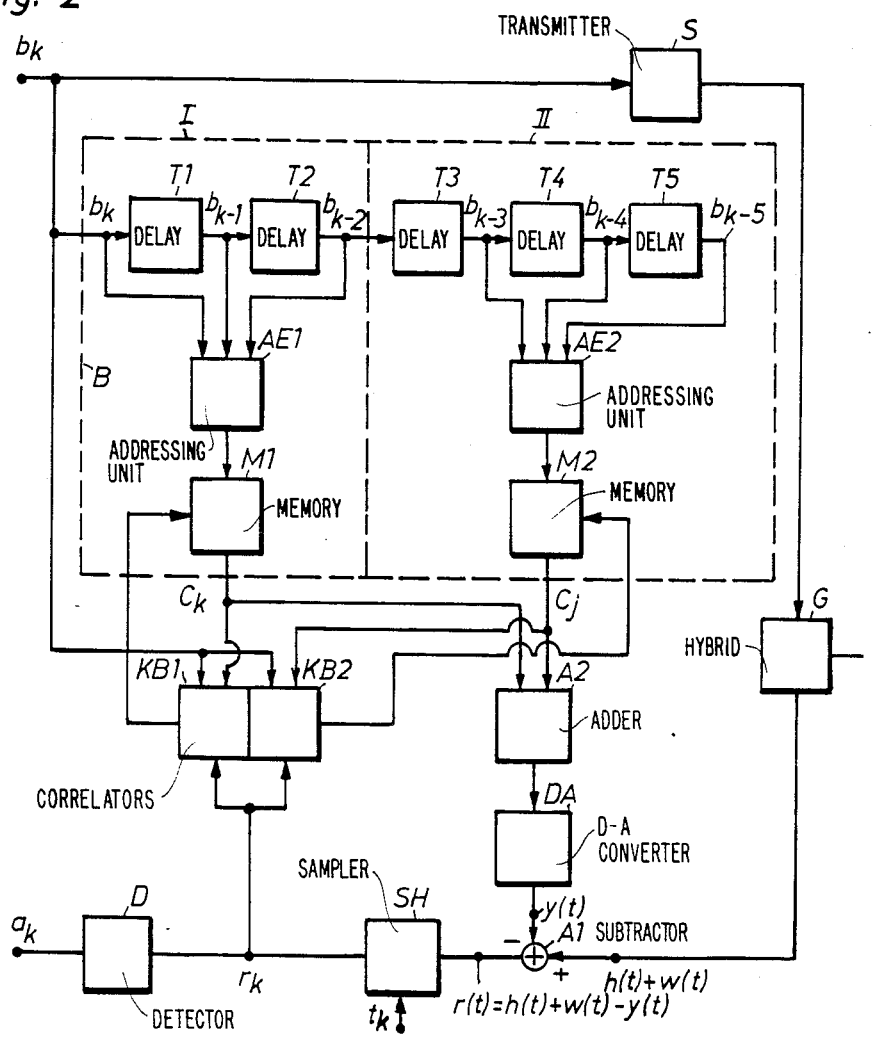
FIG. 2 is a block diagram of an embodiment of the balance filter in accordance with the invention included in the unit according to FIG. 1.
Figure 3:
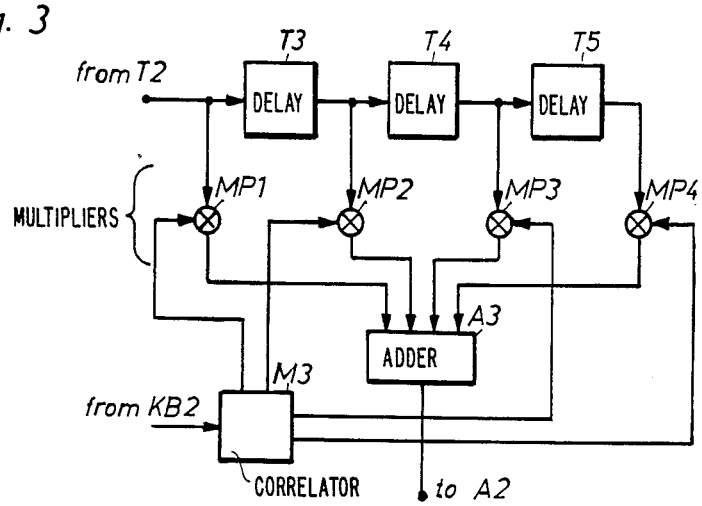
FIG. 3 illustrates an FIR filter included in another embodiment of the balance filter according to FIG. 2.

Group II according to FIG. 2, which carries out table look-up, can be replaced by a digital filter according to FIG. 3, for carrying out vector multiplication. This is suitable in the cases where N2 is large, thus requiring a large number of binary values (0 and 1) to be stored in the memory M2. The filter of FIG. 3 conventionally comprises delay circuits T3, T4, T5, the inputs of which, together with the output of T5, are connected to a summing circuit A3 via the controllable multipliers MP1-MP4. The output of the summing circuit A3 is connected to the summing circuit A2 in FIG. 2. The multipliers MP1-MP3 multiply the delayed values: $b_{k-3}$–$b_{k-5}$ by the coefficients $c_1, c_2, c_3$ the expression $$\sum_{j=1}^{3} b_{k-j} \cdot c_j$$

being formed after addition, this forming the output signal from the digital filter and corresponding to the output signal from the memory unit M2 in FIG. 2. The coefficients are supplied to the multipliers MP1-MP4 from a memory unit M3 connected to the correlator KB2 for updating, similar with updating of the coefficients in the memory unit M2 according to FIG. 2. In this case the correlation is carried out in the units KB1, KB2 by summing the products of the values $b_k$ and $r_k$ over a given number of sampling intervals, i.e. forming the function:

$$\phi_k = \sum_{j=0}^{N-1} b_k \cdot r_{k-j}.$$

Figure 4:
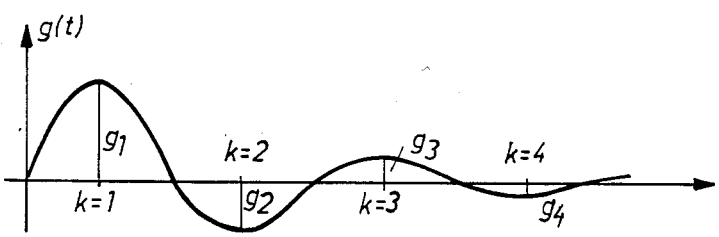
FIG. 4 is an impulse response diagram for the transmitter-receiver side in FIG. 1.

A diagram is shown in FIG. 4 for more closely illustrating the problem with nonlinearity in the transmitter-receiver part. The diagram shows the impulse response g(t) of the impulse occurring on the transmit side and from the transmit side to receive side via the units S, G, LP. The leak signal h(t) can then be denoted:

$$h(t) = \sum_{k=-\infty}^{+\infty} b_k g(t - kT) \text{ and}$$

$$h(k) = \sum_{j=1}^{N} b_{k-j} \cdot g_j$$

if N data symbols are considered and if the signal path S, G, LP is linear. A data symbol thus gives rise to the components $b_{k-1} \cdot g_2$, $b_{k-2} \cdot g_2$ etcetera. If the signal path is nonlinear, h(k) may be denoted $h(k)=f(b_k, b_{k-1}, b_{k-2}, \ldots g_1, g_2, g_3, \ldots)$. The denotation of h(k) can be approximately a nonlinear portion and a linear portion according to:

$$h(k)=f_1(b_k, b_{k-1}, b_{k-2}, g_1, g_2, g_3)+b_{k-3}\cdot g_4+b_{k-4}\cdot g_5+ \ldots b_{k-N}\cdot g_N.$$

According to the inventive concept, the balance filter is divided up according to the above in a first group I, utilizing table look-up and a second group II utilizing table look-up or vector multiplication. Group I contains a filter part which by means of table look-up imitates the nonlinear function $f_1(b_k, b_{k-1}, b_{k-2}, g_1g_2g_3)$ and group II contains an FIR-type transversal filter which imitates the linear function $b_{k-3}\cdot g_4+b_{k-4}\cdot g_5+ \ldots$.

In the embodiment according to FIG. 2, group II also comprises a filter utilizing table look-up. Since in table look-up the output signal of the filter group I (or II) does not need to be linearly related, the nonlinear part of h(t) can be imitated by the balance filter.

The advantage of dividing up the balance filter in two (or more) parts is that quicker updating of the filter coefficients $c_k$, $c_j$ in the memory units M1, M2 can be obtained. If the balance filter were only to contain solely one memory of storing N coefficients where each coefficient may have a plurality of levels, e.g. L=2 levels, the number of possible values which must be stored will be $2^N$. In the case of N=6 the memory must thus store $2^6=64$ binary values. With the proposed balance filter, the memory function is divided up into two units M1, M2 where M1 stores N1=3 and M2 stores N2=3 coefficients. The unit M1 will thus store $2^3=8$ and M2 $2^3=8$ different binary values. Since these operate in parallel, the average time between updating of each unit will only be 8/64=⅛ of the time for a single memory.

What we claim is:

1. In a transmit-receiver of a digital transmission system which includes a transmission means to a remote transmit-receiver and including a source of digital data signals, a transmitter means for transmitting a representation of the digital data signals, a hybrid junction means for connecting said transmitter means to said transmission means, an analog signal subtracting means having a minuend input connected to said hybrid junction means, a subtrahend input and a remainder output for generating a remainder signal, sampling means for periodically sampling said remainder signal and detector means for binary digitizing the sampled remainder signal, an FIR type balance filter comprising a first set of serially connected delay means each having an input and an output, the input of the first delay means of said first set being adapted to receive the digital data signals, a second set of serially connected delay means each having an input and an output, the input of the first delay means of said second set being connected to the output of the last delay means of said first set, first means responsive to the sampled remainder signal and to the combination of data signals at the outputs of the delay means of said first set for generating a first partial correction value, second means responsive to the sampled remainder signal, a combination of data signals at the outputs of the delay means of said second set for generating a second correction value, and third means having an output connected to said subtrahend input for combining said first and second correction values to form said correction signal.

2. The FIR type balance filter of claim 1 wherein said first and second correction values are digital values and said third means comprises digital adder means for forming a digital sum of said correction values and means for converting said digital sum to an analog correction signal.

3. The FIR type balance filter of claim 2 wherein said first means comprises first memory means having a plurality of addressable registers each storing one of a set of first correction values and first addressing means having inputs connected to the outputs of the delay means of said first set for generating addresses fed to said first memory means.

4. The FIR type balance filter of claim 3 wherein said first means further comprises first correlator means responsive to the digital data signal from said source, the first correction value from said first memory means and the sampled remainder signal for modifying a digital correction value stored in a register of said first memory means.

5. The FIR type balance filter of claim 4 wherein said second means comprises second memory means having a plurality of addressable register each storing one of a set of second correction values and second addressing means having inputs connected to the outputs of the delay means of said second set for generating addresses fed to said second memory means.

6. The FIR type balance filter of claim 5 wherein said second means further comprises first correlator means responsive to the digital data signal from said source, the second correction value from said second memory means and the sampled remainder signal for modifying a digital correction value stored in a register of said second memory means.

7. The FIR type balance filter of claim 4 wherein said second means comprises vector multiplying means having a plurality of multiplicand inputs respectively connected to the outputs of the delay means of said second set, a plurality of multiplier inputs and a plurality of product outputs for generating the second correction value and storing means for storing multiplier values and having outputs connected to said multiplier inputs.

8. The FIR type balance filter of claim 7 wherein said second means further comprises second correlator means responsive to the sampled remainder signal for modifying a digital correction value stored in said storing means.

9. In a transmitter-receiver unit of a telecommunication system for transmitting and receiving digital information via a hybrid across a single conductor pair, a FIR type balance filter comprising, a first and a second correction unit (KB1,KB2) for correlating the output signals from the transmitter with the signals received in the receiver unit for correction of the filter parameters (Cj,Ck), whereby the filter output signal will be similar to a leak signal through said hybrid, said links (T1-T5) being connected in series and to said transmitter unit, the number of links being divided into two groups with the first number N1 in a first group and with a second number N2 in a second group, said first group further including a first addressing unit (AE1) connected to the outputs of the links in said first group and to the output of said transmitter unit to form a digital address word from the digital value of each of the N1 first incoming data symbols ($b_k, K=1, \ldots N1$), a first coefficient memory (M1) connected to the output of said first addressing unit (AE1) for storing the filter parameters as a number of coefficients ($C_k$) whose values each correspond to said address word, and said second group further including a second addressing unit (AE2) connected to the outputs of the links in said second grouept to form a digital address word from the digital value of each of the N2 data symbols ($b_k, k=N1+1) \ldots N$) arriving at the filter input, a second coefficient memory (M2) connected to the output of the second addressing unit (AE2), a number of coefficients ($C_j$) constituting said filter parameters being stored in said second memory which each corresponds to said address words, alternatively in said second group, the outputs of the delay links being connected each via a multiplier (MP1-MP4) to an adder unit (A3) to form a transversal filter unit which performs a vector multiplication of the values ($b_k$) arriving at said second group with the coefficient values stored in a coefficient memory (M3) for said multipliers, and an adder unit (A2) connected to the outputs of said first and second groups to form said filter output signal.

10. A FIR type balance filter responsive to a series of digital data signals to emit a correction signal comprising: a first set of serially connected delay means each having an input and an output, the input of the first delay means of said first set being adapted to receive the digital data signals, a second set of serially connected delay means each having an input and an output, the input of the first delay means of said second set being connected to the output of the last delay means of said first set; first correction generating means responsive at least to the combination of data signals at the outputs of the delay means of said first set for generating a first digital partial correction value, second correction generating means responsive at least to the combination of data signals at the outputs of the delay means of said second set for generating a second digital correction value; and digital adder means for adding said first and second correction values to form a digital sum, and means for converting said digital sum to an analog correction signal; at least one of said correction generating means comprising memory means having a plurality of addressable registers each storing one of a set of correction values and addressing means having inputs connected to the outputs of the delay means of the associated set for generating addresses fed to first memory means.

11. An FIR type balance filter responsive to a series of digital data signals to emit a correction signal comprising: a first set of serially connected delay means each having an input and an output, the input of the first delay means of said first set being adapted to receive the digital data signals, a second set of serially connected delay means each having an input and an output, the input of the first delay means of said second set being connected to the output of the last delay means of said first set; first means responsive at least to the combination of data signals at the outputs of the delay means of said first set for generating a first digital partial correction value; second means responsive at least to the combination of data signals at the outputs of the delay means of said second set for generating a second digital correction value, said second means comprising vector multiplying means having a plurality of multiplicand inputs respectively connected to the outputs of the delay means of said second set, a plurality of multiplier inputs and a plurality of product outputs for generating the second digital correction value and storing means for storing multiplier values and having outputs connected to said multiplier inputs; and digital adder means for adding said first and second correction values to form a digital sum; and means for converting said digital sum to an analog correction signal.

* * * * *